United States Patent [19]
Jelinger

[11] Patent Number: 5,880,932
[45] Date of Patent: Mar. 9, 1999

[54] MODULAR POWER SUPPLY

[75] Inventor: Conrad A.H. Jelinger, Toledo, Ohio

[73] Assignee: Unitrend, Inc., Toledo, Ohio

[21] Appl. No.: 970,330

[22] Filed: Nov. 14, 1997

[51] Int. Cl.$^6$ ...................................................... H05H 7/20
[52] U.S. Cl. ........................... 361/695; 307/150; 361/829
[58] Field of Search ............................ 307/150; 361/600, 361/679, 686, 690, 694–695, 730, 829, 831

[56]  References Cited

U.S. PATENT DOCUMENTS

| | | | |
|---|---|---|---|
| 4,926,291 | 5/1990 | Sarrat ........................................ | 361/687 |
| 5,089,937 | 2/1992 | Carrubba et al. ........................ | 361/695 |
| 5,224,024 | 6/1993 | Tu et al. .................................... | 361/831 |
| 5,287,244 | 2/1994 | Hileman et al. .......................... | 361/697 |
| 5,703,751 | 12/1997 | Huang ..................................... | 307/150 |

*Primary Examiner*—Gregory Thompson
*Attorney, Agent, or Firm*—MacMillan, Sobanski & Todd, LLC

[57] ABSTRACT

The present invention provides a modular power supply to be used in a personal computer or other similar device. The preferred embodiment of the present invention includes a base assembly, a power supply housing, a power supply, and a fan assembly. The base assembly provides a foundation for the modular power supply and includes a terminal board attached thereto and a system common quick-disconnect embedded therein which serves as a central junction for the distribution of power to the various electrical components. The power supply housing provides a protective structure for the power supply contained therein. The fan assembly provides cooling for the power supply and is mounted on the outside of the power supply housing. The power supply is electrically connected to the system common quick disconnect which in turn feeds the terminal board attached to the base assembly, the fan assembly, and any other components located within the base assembly. The terminal board provides access to power for peripheral components such as logic cards, I/O boards, and the like. The use of multiple quick-disconnect electrical connectors allows components such as the power supply and fans to be replaced without detaching the components which are normally "hard wired" to the power supply.

3 Claims, 3 Drawing Sheets

MODULAR POWER SUPPLY

FIELD OF THE INVENTION

The present invention relates to a power supply; more specifically, the present invention relates to a modular power supply used in a personal computer.

BACKGROUND

A recurring problem in the continued use of personal computers and other like devices is the time involved and difficulty in replacing a failed component. For example, if a power supply fails ands needs to be replaced, the user or technician must disconnect all the components wired to the power supply before removal of the failed unit. Disconnecting the a myriad of components and then reconnecting them after replacement of the failed unit is an inefficient use of technician time and owner finances at best.

The forgoing discussion suggests not only the desirability of a power supply which contains components which are easily replaced, but also suggests the various applications for which such a device may be used. Accordingly, the present invention provides a solution to the problems mentioned above.

SUMMARY

The present invention provides a modular power supply to be used in a personal computer or other similar device which addresses the problems mentioned above. The preferred embodiment of the present invention includes a base assembly, a power supply housing, a power supply, and a fan assembly. The base assembly provides a foundation for the modular power supply and includes a terminal board attached thereto. The power supply housing provides a protective structure for the power supply contained therein. The fan assembly provides cooling for the power supply and is mounted on the outside of the power supply housing.

The base assembly contains a "system common" electrical connector embedded within which serves as a central junction for supplying power to the various electrical components. The power supply is electrically connected to the system common electrical connector which in turn feeds the terminal board attached to the base assembly, the fan assembly, and any other components located within the base assembly. The terminal board provides access to power for peripheral components such as logic cards, I/O boards, and the like.

The power supply housing provides structural protection for the power supply circuit board and related components.

The novel fan assembly provides improved cooling for internal components by utilizing an angled installation on the front of the power supply housing.

Accordingly, it is an object of the present invention to provide an improved power supply which allows for easy replacement of failed components.

It is a further object of the present invention to provide an improved power supply which utilizes multiple quick-disconnect devices and a central junction for power distribution.

It is a still further object of the present invention to provide an improved power supply which utilizes a fan assembly mounted on the power supply housing at an angle to increase cooling efficiency.

Still further objects and advantages of the present invention will become apparent by reference to the following description of the preferred and alternate embodiments and appended drawings.

BRIEF DESCRIPTIONS OF THE DRAWINGS

DETAILED DESCRIPTION OF THE PREFERRED EMBODIMENT

Figure 3:
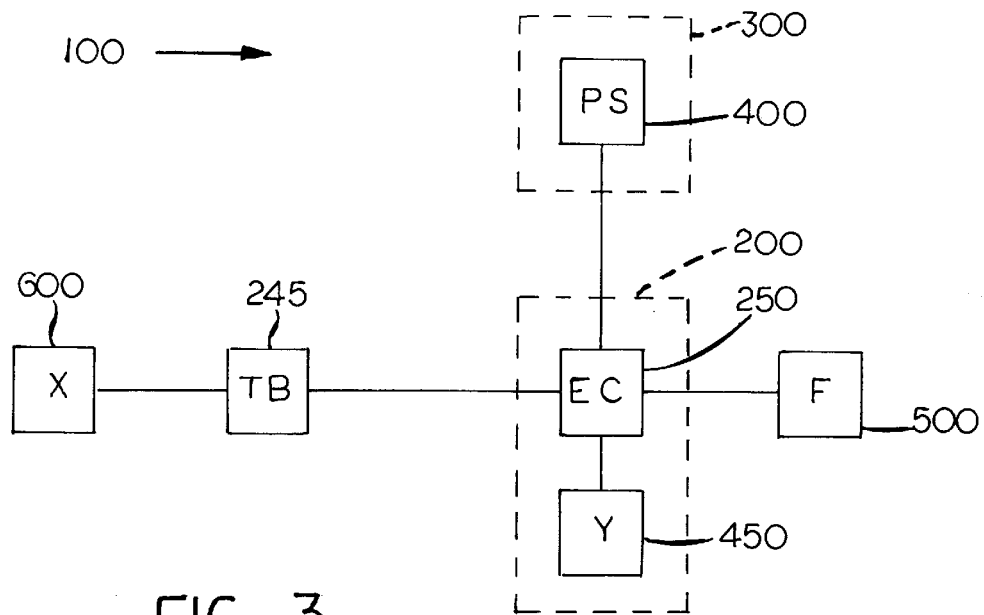
FIG. 3 shows a block diagram of the invention shown in FIG. 1.
Figure 1:
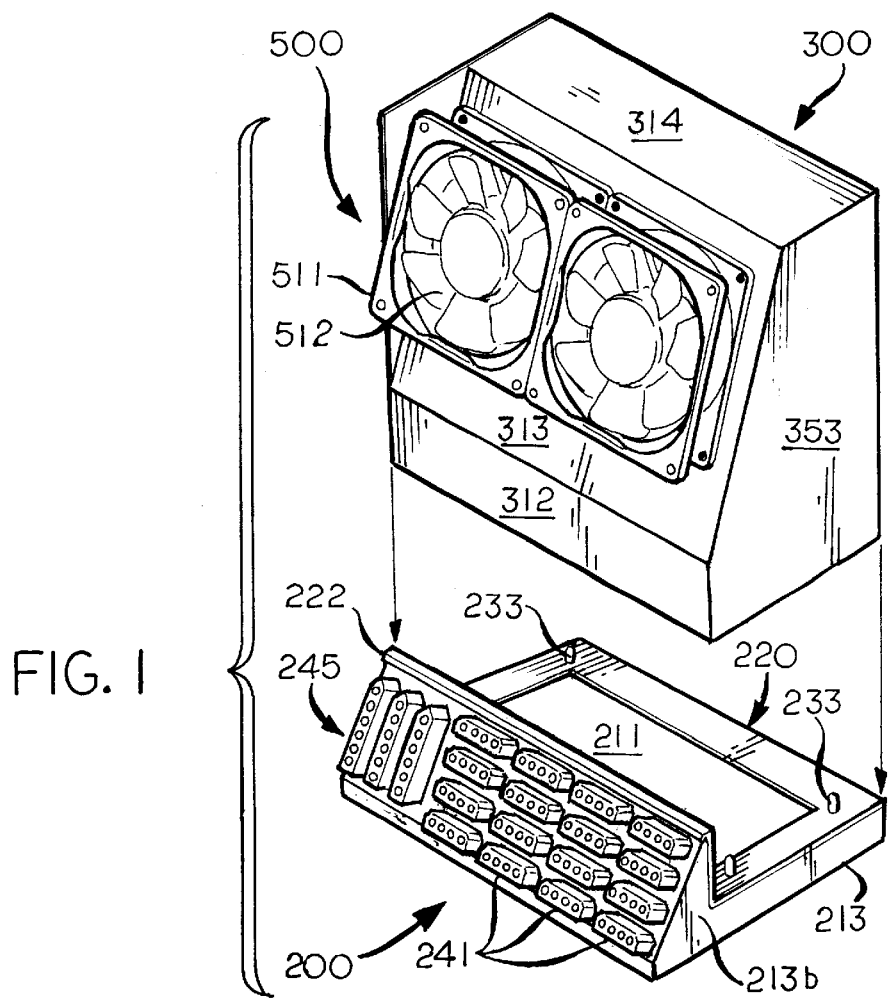
FIG. 1 shows a partially exploded perspective view of the preferred embodiment of the present invention.

Referring now to FIGS. 1–4, the modular power supply 100 of the present invention includes a base assembly 200, a power supply housing 300, a power supply 400 and a fan assembly 500.

Figure 2:
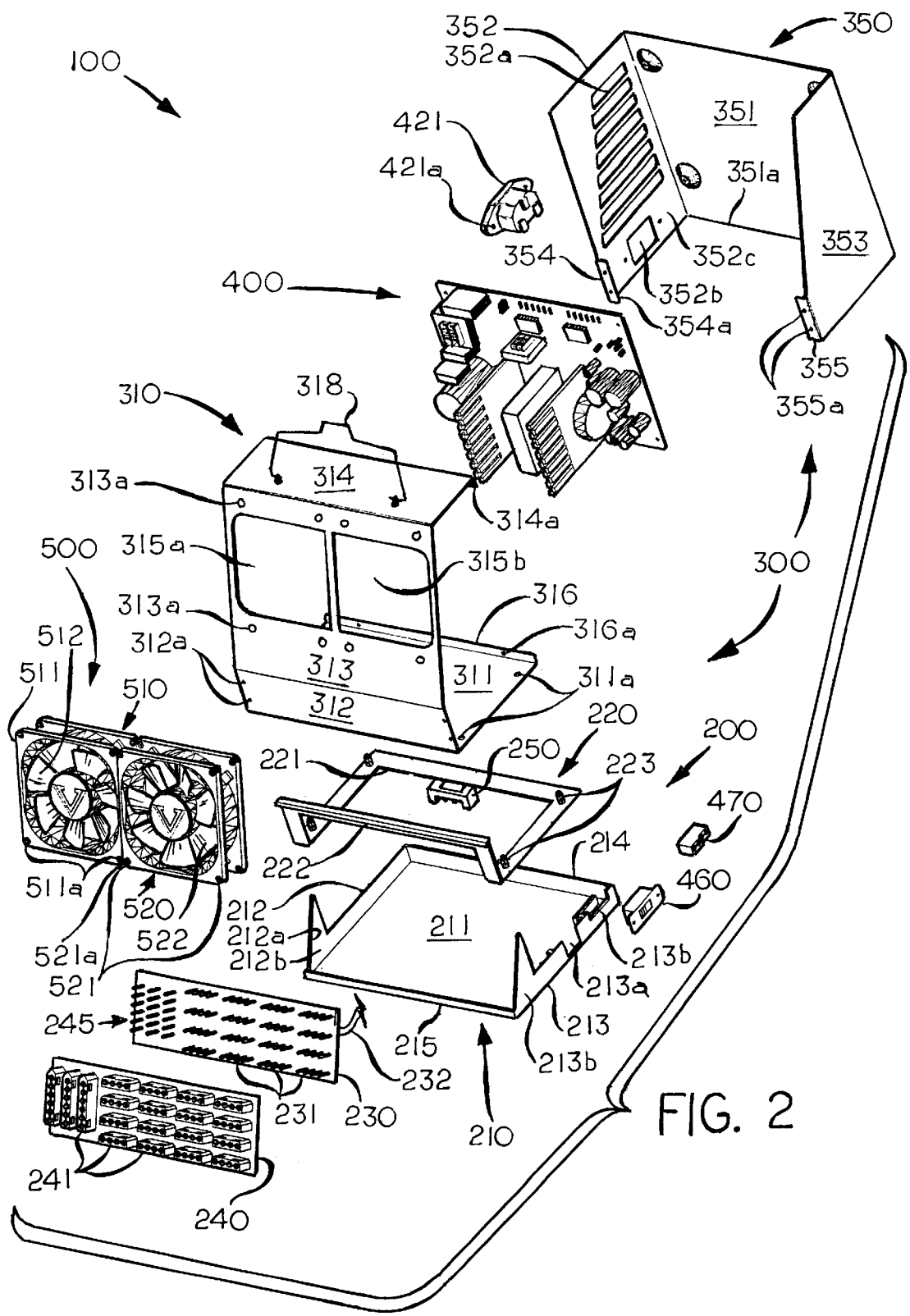
FIG. 2 shows an exploded perspective view of the invention shown in FIG. 1.
Figure 4:
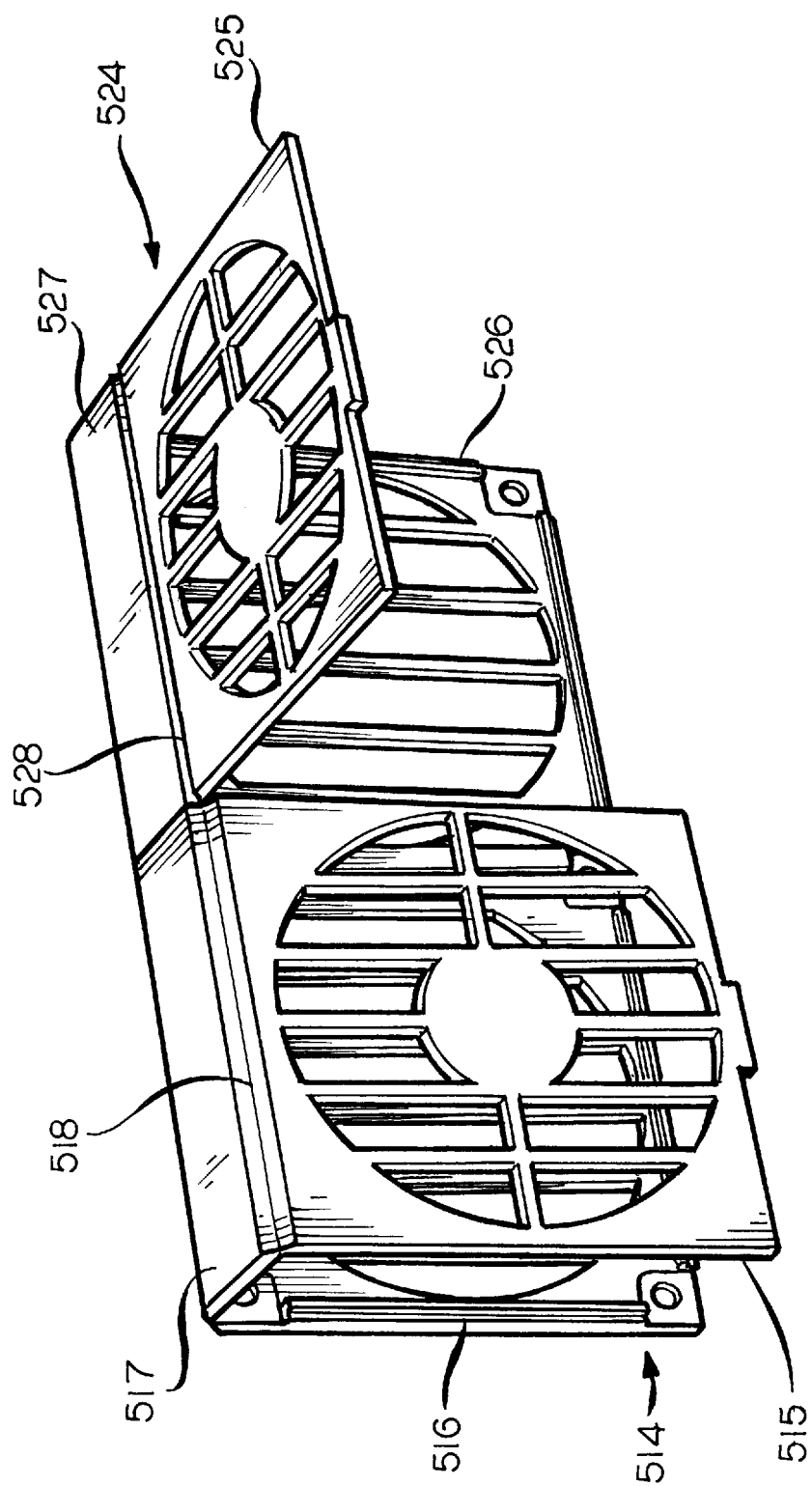
FIG. 4 shows a perspective view of the fan shroud assembly of the invention shown in FIG. 1.

The base assembly is constructed as follows. The base assembly 200 has a lower member 210 which includes a floor 211, two side walls 212 and 213, a rear wall 214, and a front lip 215 which forms a tray-like structure, best shown in FIG. 2. The lower member 210 is of sufficient dimensions to allow a battery backup (not shown) to be placed therein. The side wall 212 includes a wall portion 212a which is generally triangular in shape and has a ledge 212b formed on the upper edge of the wall portion 212a as shown in FIG. 2. The wall portion 212a is tapered to slope away from the front lip 215 at an angle of approximately 30° from vertical in the preferred embodiment. Similarly, the side wall 213 has a triangular wall portion 213a with a ledge (not shown) formed in the upper edge. The wall portion 213a is also tapered away from the front lip 215 at an angle of about 30° from vertical. The side wall 213 also includes openings 213a and 213b for a voltage select switch 460 and a female portion of an electrical connector 470. The voltage select switch 460 allows the user to select the proper input voltage, either 115VAC or 250vAC, depending upon the geographical location of the computer. The electrical connector 470 allows for the use of a voltage on/off switch. Both the voltage select switch 460 and the electrical connector 470 are wired to a "system common" electrical quick-disconnect 250 which is described in detail later herein. The lower member 210 of the base assembly 200 of the preferred embodiment is made of PVC, typically injection molded into a single unitary construction, but could be constructed of any suitable material using like techniques.

The base assembly 200 also includes an upper member 220 having a frame 221 with a frame lip 222 and alignment pegs 223. Molded directly within the frame 221 is the system common electrical quick-disconnect 250 which serves as a central junction for supplying power to the various electrical components. The upper member 220 may be constructed of the same material and using the same fabrication process as the lower member 210.

Furthermore, the base assembly 200 includes a terminal board 230 and a terminal block substrate 240, best shown in FIG. 2. The terminal board 230 contains a plurality of standard electrical terminals 231 which may be arranged in any convenient pattern. The terminal board 230 is typically constructed of a resin fiber material or the like. The terminal block substrate 240 contains a plurality of terminal blocks 241 which are formed as an integral part of the terminal block substrate 240. The terminal blocks 241 are phased to prevent an accidental reverse polarity connection to the power supply 400. In the preferred embodiment, the terminal block substrate 240 and terminal blocks 241 are made of a nylon material or equivalent.

To complete the construction of the base assembly 200, the terminal board 230 is married to the terminal block substrate 240 by inserting the electrical terminals 231 into the corresponding terminal blocks 241 from the rear, forming a terminal assembly 245. The terminal assembly 245 is then placed onto the lower member 210 of the base assembly 200 such that the lower edge of the terminal assembly 245 rests on the floor 211 of the lower member 210 and also engages the front lip 215 while each of the side edges of the terminal assembly 245 engages the ledges 212b and 213b of side wall portions 212a and 213a, respectively, as shown in FIG. 2. The terminal assembly 245 is electrically connected to the power supply 400 via a 16-pin connector (not shown) which is attached to the rear of terminal board 240 and a wiring ribbon 232 of standard construction is electrically connected to the system common quick-disconnect 250. The upper member 220 of the base assembly 200 is then placed on the lower member 210 such that the lower surface of the upper member 220 rests on the upper surface of the lower member 210 while the frame lip 222 of the upper member 220 engages the top edge of the terminal assembly 245. When complete, the terminal assembly 245 rests on the ledges 212b and 213b and is held securely in place between frame lip 222 and front lip 215.

The power supply housing 300 includes a front shell 310 and a rear shell 350. In the preferred embodiment, the front shell 310 is stamped and bent from a single piece of 16-gauge steel or the like to form a housing floor 311, a housing riser 312, a front face 313, a housing top 314, and a housing floor lip 316, all shown best in FIG. 2. The front shell 310 of the power supply housing 300 also includes fan openings 315a and 315b located in the front face 313, fastener holes 311a and 312a located in the housing floor 311 and housing riser 312, respectively, as well as fastener holes 316a located in housing floor lip 316 and fan mounting holes 313a also located in the front face 313 of the power supply housing 300. The front shell 310 also includes a carrying handle 318 hingedly attached to the housing top 314 which folds down in a locked position when not being used to remove the modular power supply 100. The carrying handle 318 also provides a locking tab (not shown) which engages a slot (not shown) in the computer chassis (not shown) to aid in securing the modular power supply 100 within the chassis (not shown).

The rear shell 350 of the power supply housing 300, like the front shell 310, is stamped and bent from a single piece of 16-gauge steel or the like. The rear shell 350 includes a rear wall 351, and side walls 352 and 353. The rear wall 351 contains fastener holes 351a therein. The side wall 352 has louvers 352a and opening 352b cut or stamped therein. The side walls 352 and 353 have side wall flaps 354 and 355, respectively, which in turn have fastener holes 354a and 355a, respectively.

To complete the assembly of the power supply housing 300, a power supply 400 of standard construction is fixed within the housing 300, either to the rear wall 351 or to the housing floor 311, using screws, clips, or the like. The front shell 310 and the rear shell 350 are then brought together, aligning the corresponding fastener holes: holes 312a are aligned with 354a and 355a and holes 316a are aligned with holes 351a. Fasteners (not shown) such as screws, quick-disconnect connectors, or the like are inserted through the holes to securely hold the front shell 310 and the rear shell 350 of the power supply housing 300 together.

The final assembly included in the modular power supply 100 is the fan assembly 500. In the preferred embodiment, the fan assembly 500 is an off-the-shelf dual fan arrangement which includes fan frames 511 and 521 having mounting holes 511a and 521a, respectively, and fans 512 and 522. The fan assembly 500 is mounted to the front face 313 of the front shell 310 by aligning mounting holes 511a and 521a with mounting holes 313a and securing it using screws, quick-disconnect bolts or the like. Both fans 510 and 520 are wired to the system common quick disconnect 250 for required power. The fan assembly 500 also includes fan shrouds 514 and 524, shown in FIG. 4, which are used in conjunction with fans 510 and 520, respectively. The fan shroud 514 includes a front wall 515, a rear wall 516, a top 517, and a hinge 518. Similarly, the fan shroud 524 includes a front wall 525, a rear wall 526, a top 527, and a hinge 528. The fans 510 and 520 are positioned within the fan shrouds 514 and 524, respectively, before being mounted to the front face 313 of the front shell 310. The rear walls 516 and 526 of the fan shrouds 514 and 524 provide electrical and mechanical insulation between the fans 510 and 520, respectively, and the front face 313. The front walls 515 and 525 serve as protective screens for the fans 510 and 520 to prevent debris from entering the fans 510 and 520. Furthermore, the front walls 515 and 525 have hinges 518 and 528 to allow the fans 510 and 520 to be easily replaced.

An overall view of the wiring scheme of the present invention is as follows. Referring now to the block diagram of FIG. 3, the power supply (PS) 400 physically located within the power supply housing 300 supplies power to the system common quick-disconnect (EC) 250 which is located within the base assembly 200. Power is supplied from the EC 250 to a terminal board (TB) 245 which in turn feeds peripherals (X) 600 which may include logic cards (not shown), I/O boards (not shown), and the like. The EC 250 also feeds power to the fan assembly (F) 500 and any other internal components (Y) 450 which may be located within the base assembly 200 such as the voltage select switch 460, the electrical connector 470, etc.

To complete the assembly of the modular power supply 100, the power supply housing 300, along with the power supply 400 contained therein, is positioned onto the base assembly 200 by lowering the power supply housing 300 onto the upper frame member 220 such that the alignment pegs 223 of the upper frame member 220 engage the alignment holes 311a of the front shell floor 311 and the power supply connector (not shown) engages the system common quick disconnect 250. Replacement of the modular power supply 100 can now be achieved without completely disconnecting any of the peripheral components 600 located within the remainder of the computer housing (not shown). For example, if the power supply 400 fails, it can be replaced by simply lifting the power supply housing 300 off the upper frame member 220 of the base assembly 200 whereby disconnecting the wiring at the system common quick-disconnect 250.

Although the best mode contemplated by the inventors for carrying out the present invention as of the filing date hereof has been shown and described herein, it will be apparent to those skilled in the art that suitable modifications, variations, and equivalents may be made without departing from the scope of the invention, such scope being limited solely by the terms of the following claims.

What is claimed is:

1. A modular power supply comprising:
   a base assembly comprising a base having a terminal board mounted thereon, said base further comprising an system common quick-disconnect embedded therein, said terminal board being electrically connected to said system common quick-disconnect embedded in said base;

a power supply housing being attached to said base assembly;

a power supply being contained within said power supply housing, said power supply being electrically connected to said system common quick-disconnect;

a fan assembly being attached to said power supply housing, said fan assembly further being electrically connected to said system common quick-disconnect in said base.

2. The modular power supply according to claim 1 wherein said fan assembly is mounted on said power supply housing at an angle with respect to a vertical plane.

3. The modular power supply according to claim 2 wherein said angle of said fan assembly is approximately 30°.

* * * * *